US009559185B2

(12) United States Patent
Tak et al.

(10) Patent No.: US 9,559,185 B2
(45) Date of Patent: Jan. 31, 2017

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Yong-Suk Tak, Seoul (KR); Gyeom Kim, Hwaseong-Si (KR); Ki-Yeon Park, Hwaseong-Si (KR); Sung-Hyun Choi, Suwon-Si (KR); Bon-Young Koo, Suwon-Si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/134,906

(22) Filed: Apr. 21, 2016

(65) Prior Publication Data

US 2016/0372567 A1   Dec. 22, 2016

(30) Foreign Application Priority Data

Jun. 18, 2015   (KR) .................. 10-2015-0086305

(51) Int. Cl.
*H01L 21/02* (2006.01)
*H01L 29/66* (2006.01)
(Continued)

(52) U.S. Cl.
CPC ....... *H01L 29/6656* (2013.01); *H01L 29/0653* (2013.01); *H01L 29/0847* (2013.01); *H01L 29/161* (2013.01); *H01L 29/165* (2013.01); *H01L 29/7848* (2013.01); *H01L 29/7851* (2013.01)

(58) Field of Classification Search
CPC ............ H01L 29/6656; H01L 29/7848; H01L 29/7851; H01L 29/0653; H01L 29/0847; H01L 29/165; H01L 29/161
See application file for complete search history.

(56) References Cited

U.S. PATENT DOCUMENTS 7,780,865 B2   8/2010   Balseanu et al.
7,790,561 B2   9/2010   Rouse et al.
(Continued)

FOREIGN PATENT DOCUMENTS

JP   2013-135176   7/2013
JP   2014-232874   12/2014
(Continued)

*Primary Examiner* — Thanh Y Tran
(74) *Attorney, Agent, or Firm* — F. Chau & Assoicats, LLC

(57) ABSTRACT

A semiconductor device includes a substrate including an active fin structure, a plurality of gate structures, a first spacer on sidewalls of each of the gate structures, and a second spacer on sidewalls of the first spacer. The active fin structure may extend in a first direction and including a plurality of active fins with adjacent active fins divided by a recess. Each of the plurality of gate structures may extend in a second direction crossing the first direction, and may cover the active fins. The first spacer may include silicon oxycarbonitride (SiOCN), and may have a first carbon concentration. The second spacer may include SiOCN and may have a second carbon concentration which is different from the first carbon concentration. The semiconductor device may have a low parasitic capacitance and good electrical characteristics.

20 Claims, 17 Drawing Sheets

(51) Int. Cl.
    *H01L 29/78*       (2006.01)
    *H01L 29/161*     (2006.01)
    *H01L 29/165*     (2006.01)
    *H01L 29/08*       (2006.01)
    *H01L 29/06*       (2006.01)

(56) References Cited

U.S. PATENT DOCUMENTS

| | | |
|---|---|---|
| 8,012,871 B2 | 9/2011 | Ohmori et al. |
| 8,436,404 B2 | 5/2013 | Bohr et al. |
| 8,785,333 B2 | 7/2014 | Hashimoto et al. |
| 2011/0256733 A1 | 10/2011 | Hirose et al. |
| 2013/0149874 A1 | 6/2013 | Hirose et al. |
| 2013/0164946 A1 | 6/2013 | Suzuki et al. |
| 2013/0248949 A1 | 9/2013 | Kirkpatrick et al. |
| 2013/0341685 A1 | 12/2013 | Chou et al. |
| 2014/0051261 A1 | 2/2014 | Ota et al. |
| 2014/0057452 A1 | 2/2014 | Hashimoto et al. |
| 2014/0369115 A1* | 12/2014 | Kim ................ H01L 29/78 365/182 |
| 2015/0270342 A1* | 9/2015 | Tsai ............... H01L 29/0847 257/43 |
| 2016/0141381 A1* | 5/2016 | Kim ............... H01L 29/42364 257/288 |

FOREIGN PATENT DOCUMENTS

| | | |
|---|---|---|
| KR | 10-1454603 | 10/2014 |
| KR | 10-1476550 | 12/2014 |

\* cited by examiner

FIG. 3
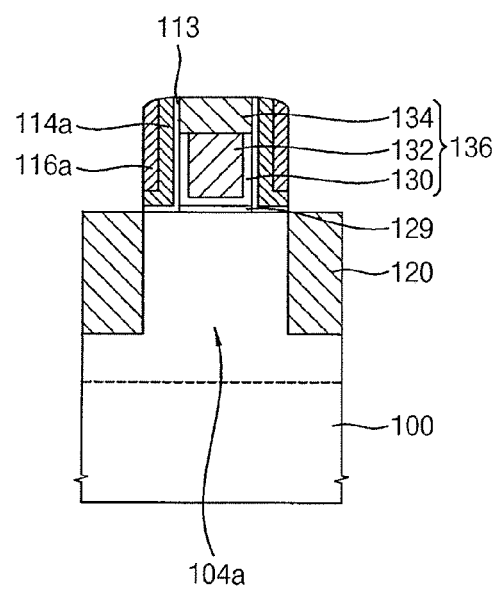
FIG. 4
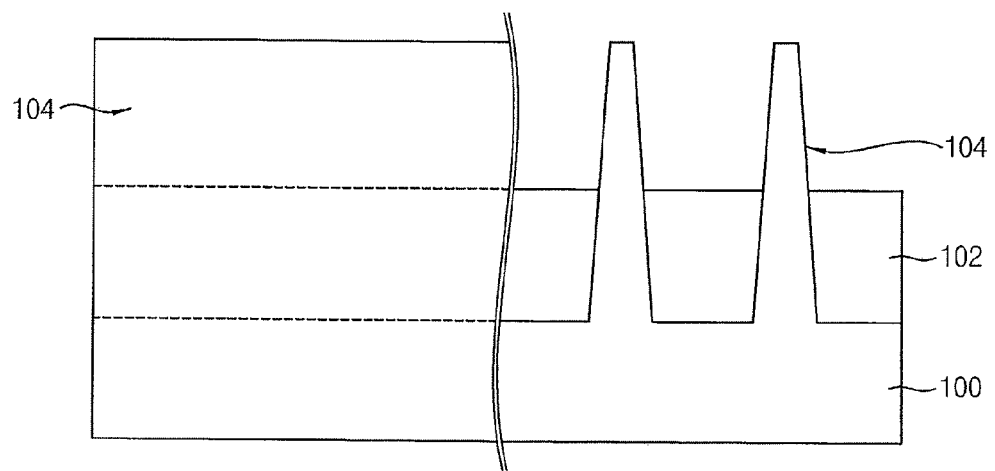
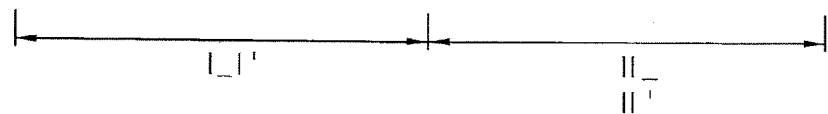

SEMICONDUCTOR DEVICES AND METHODS OF MANUFACTURING THE SAME

CROSS-REFERENCE TO RELATED APPLICATION

This application claims priority under 35 USC §119 to Korean Patent Application No. 10-2015-0086305, filed on Jun. 18, 2015 in the Korean Intellectual Property Office, the contents of which are incorporated by reference herein in their entirety.

TECHNICAL FIELD

The present invention relates generally to a semiconductor device and a method of manufacturing the same, and more particularly, to a semiconductor device including a FinFET and a method of manufacturing the same.

BACKGROUND

A spacer may be formed on sidewalls of a gate structure in a FinFET. The spacer may protect the gate structure during an etching process, and may also have a low dielectric constant so that a parasitic capacitance between gate structures may be lowered.

SUMMARY

Aspects of the present invention include providing a semiconductor device including a FinFET having good characteristics, and providing a method of manufacturing the semiconductor device.

According to an aspect of the present invention, there is provided a semiconductor device. The semiconductor device includes a substrate including an active fin structure, a plurality of gate structures, a first spacer on sidewalls of each of the gate structures, and a second spacer on sidewalls of the first spacer. The active fin structure may extend in a first direction and include a plurality of active fins with adjacent active fins divided by a recess. Each of the plurality of gate structures may extend in a second direction crossing the first direction, and may cover the active fins. The first spacer may include silicon oxycarbonitride (SiOCN), and may have a first carbon concentration. The second spacer may include SiOCN and may have a carbon second concentration which is different from the first carbon concentration. The first carbon concentration may be higher than the second carbon concentration. The difference between the first and second carbon concentrations may be in a range of about 3% to about 14%. The first carbon concentration is in a range of about 4% to about 15%. The first spacer may have a first nitrogen concentration, and the second spacer may have a second nitrogen concentration which is higher than the first nitrogen concentration. Each of the first and second spacers may have an oxygen concentration in a range of about 20% to about 40%. Oxygen concentrations of the first and second spacers may be substantially equal to each other or different from each other. Silicon concentrations of the first and second spacers may be substantially equal to each other.

The recess may be formed between the second spacers. Each of the gate structures may include a gate insulation pattern, a gate electrode and a hard mask sequentially stacked, and the gate insulation pattern may surround sidewalls and a bottom of the gate electrode. The semiconductor device may further include an epitaxial pattern in the recess. The semiconductor device may further include an insulating interlayer covering the gate structure and the first and second spacers on the substrate, and a contact plug (i.e., contact structure) penetrating through the insulating interlayer and contacting a portion of the second spacer and a top surface of the epitaxial pattern.

According to another aspect of the present invention, there is provided a semiconductor device. The semiconductor device includes a substrate including an active fin structure, a plurality of gate structures, a first spacer on sidewalls of each of the gate structures, and a second spacer on sidewalls of the first spacer. The active fin structure may extend in a first direction. Each of the plurality of gate structures may extend in a second direction and may cross the first direction. The first spacer may include silicon oxycarbonitride (SiOCN), and may have a first carbon concentration. The second spacer may include SiOCN, and may have a second carbon concentration which is different from the first carbon concentration. The first carbon concentration may be higher than the second carbon concentration. The difference between the first and second carbon concentrations may be in a range of about 3% to about 14%. The first carbon concentration is in a range of about 4% to about 15%. The first spacer may have a first nitrogen concentration, and the second spacer may have a second nitrogen concentration which is higher than the first nitrogen concentration. Each of the first and second spacers may have an oxygen concentration in a range of about 20% to about 40%. Oxygen concentrations of the first and second spacers may be substantially equal to each other or different from each other. Silicon concentrations of the first and second spacers may be substantially equal to each other. The active fin structure may include a recess between the second spacers, and the semiconductor device further includes an epitaxial pattern in the recess.

According to yet another aspect of the present invention, there is provided a method of manufacturing a semiconductor device. In the method, a portion of a substrate may be etched to form a preliminary active fin structure extending in a first direction. A plurality of preliminary gate structures may be formed on the substrate. Each of the preliminary gate structures may extend in a second direction substantially perpendicular to the first direction. A first spacer layer may be formed on a sidewall of the preliminary gate structure. The first spacer layer may include silicon oxycarbonitride (SiOCN) and have a first carbon concentration. A second spacer layer may be formed on a sidewall of the first spacer layer. The second spacer layer may include silicon oxycarbonitride (SiOCN) and have a second carbon concentration. The first and second spacer layers may be etched to form first and second spacers, respectively. The preliminary active fin structure may be anisotropically etched to form an active fin structure including a recess between the second spacers. The preliminary gate structure may be transformed to a gate structure.

The first and second spacer layers may be formed in-situ or ex-situ. The first carbon concentration may be higher than the second carbon concentration. The first and second spacer layers may be formed by a chemical vapor deposition (CVD) process, an atomic layer deposition (ALD) process, or a physical vapor deposition (PVD) process. The preliminary gate structure may be isotropically etched to form an opening, and a gate structure including a gate insulation pattern, a gate electrode and hard mask may be formed in the opening. The gate insulation pattern may surround the sidewalls and bottom of the gate electrode.

BRIEF DESCRIPTION OF THE DRAWINGS

Exemplary embodiments of the inventive concept may best be understood from the following detailed description taken in conjunction with the accompanying drawings, and in which:

FIG. 3 is a cross-sectional view illustrating a portion of a gate structure in the semiconductor device according to an exemplary embodiment of the inventive concept;

FIGS. 4 to 14 are cross-sectional views illustrating stages of a method of manufacturing a semiconductor device according to an exemplary embodiment of the inventive concept;

Figure 1:
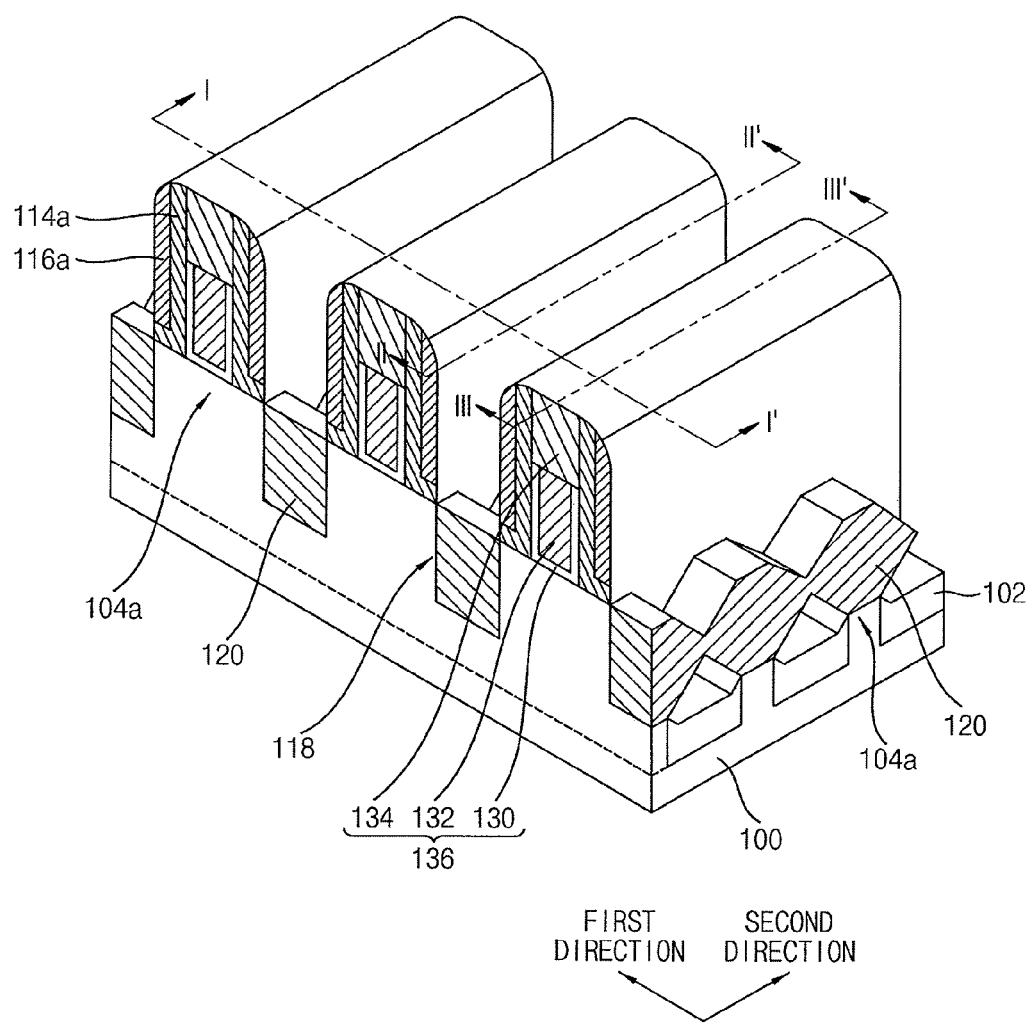
FIGS. 1 and 2 are a perspective view and a cross-sectional view, respectively, illustrating a semiconductor device according to an exemplary embodiment of the inventive concept.

Since the drawings in FIGS. 1-18 are intended for illustrative purpose, the elements in the drawings are not necessarily drawn to scale. For example, some of the elements may be enlarged or exaggerated for clarity purpose.

DETAILED DESCRIPTION OF EXEMPLARY EMBODIMENTS

Exemplary embodiments of the inventive concept will be described more fully hereinafter with reference to the accompanying drawings, in which the exemplary embodiments of the inventive concept are shown. The present inventive concept may, however, be embodied in many different forms and should not be construed as limited to the exemplary embodiments set forth herein. Rather, these exemplary embodiments are provided with thorough and complete description so as to fully convey the scope of the present inventive concept to those skilled in the art.

It will be understood that when an element or layer is referred to as being "on", "connected to" or "coupled to" another element or layer, it can be directly on, connected or coupled to the other element or layer, or intervening elements or layers may be present. In contrast, when an element or layer is referred to as being "directly on", "directly connected to" or "directly coupled to" another element or layer, there are no intervening elements or layers present. Like numerals refer to like elements throughout the specification. As used herein, the term "and/or" includes any and all combinations of one or more of the associated listed items.

It will be understood that, although the terms "first", "second", "third", "fourth", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, or vice versa, without departing from the teachings of the present inventive concept.

Spatially relative terms, such as "beneath", "below", "lower", "above", "upper" and the like, may be used herein to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be oriented differently (for example, rotated 90 degrees or at other orientations) and the spatially relative descriptors used herein would then be interpreted accordingly.

The terminology used herein is for the purpose of describing particular exemplary embodiments and is not intended to be limiting of the present inventive concept. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concept are described herein with reference to the cross-sectional illustrations that are schematic illustrations of idealized exemplary embodiments. As such, variations from the shapes of the illustrations caused from, for example, various manufacturing techniques and/or tolerances, are to be expected. Thus, exemplary embodiments of the inventive concept should not be construed as limited to the particular shapes of regions illustrated herein but are to include deviations in shapes that result, for example, from manufacturing. The regions illustrated in the figures are schematic in nature and their shapes are not intended to illustrate the actual shapes of the regions of a device, and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
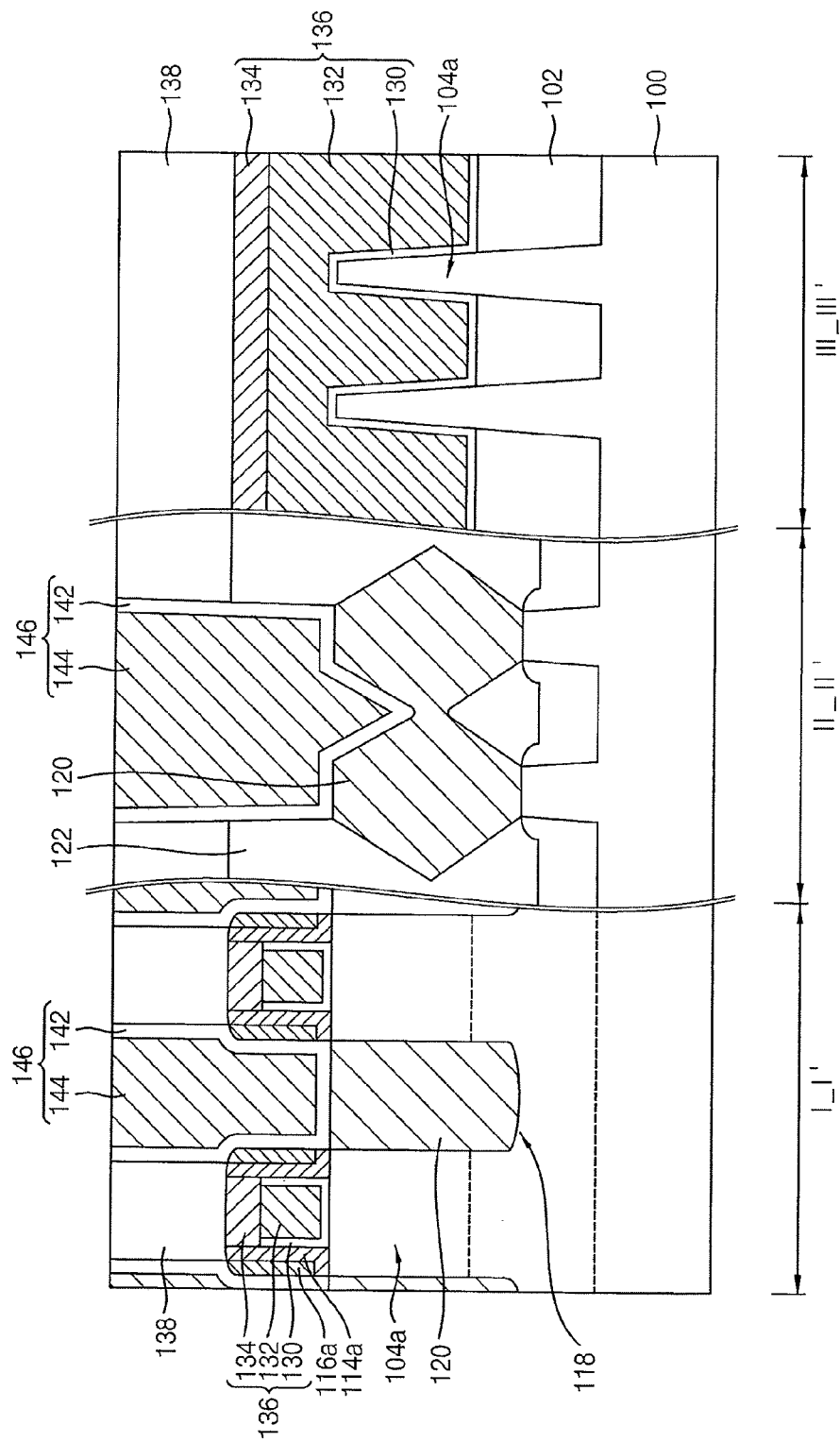

FIGS. 1 and 2 are a perspective view and a cross-sectional view, respectively, illustrating a semiconductor device according to an exemplary embodiment of the inventive concept. FIG. 3 is a cross-sectional view illustrating a portion of a gate structure in the semiconductor device. In FIG. 1, a contact plug, i.e., a contact structure, is omitted for the convenience of explanation. FIG. 2 includes cross-sectional views taken along lines I-I', II-II' and III-III', respectively, in FIG. 1.

Referring to FIGS. 1, 2 and 3, the semiconductor device may include a substrate 100, an active fin 104a, a gate structure 136, an epitaxial pattern 120, a first spacer 114a and a second spacer 116a. The semiconductor device may further include an isolation layer 102, a contact structure 146, a first insulating layer 122, and a second insulating layer 138.

The substrate 100 may include a semiconductor material, e.g., silicon, germanium, or silicon-germanium, or a □-□ group semiconductor compound, e.g., GaP, GaAs, or GaSb. In some embodiments, the substrate 100 may be a silicon-on-insulator (SOI) substrate, or a germanium-on-insulator (GOI) substrate. The substrate 100 may have crystallinity, preferably, single crystallinity.

The active fin 104a may include a first pattern extending in a first direction and a second pattern protruding upwardly from a top surface of the first pattern. The active fin 104a may include a material substantially the same as a material of the substrate 100. In an exemplary embodiment of the inventive concept, a plurality of active fins 104a may be arranged in a second direction substantially perpendicular to the first direction. A portion of the active fin 104a may not be covered by the isolation layer 102, and may serve as an effective active region.

In an exemplary embodiment of the inventive concept, a plurality of second patterns may be formed in the first direction, and a recess 118 may be formed between the second patterns disposed in the first direction. An active fin structure may be formed including the active fin 104a and the recess 118. A bottom of the recess 118 may be lower than the top surface of the isolation layer 102 under the gate structure 136. The isolation layer 102 may include an oxide, e.g., silicon oxide.

In an exemplary embodiment of the inventive concept, the gate structure 136 may extend in the second direction, and may cover a top surface and a sidewall of the active fin 104a, and a plurality of gate structures 136 may be formed in the first direction.

In an exemplary embodiment of the inventive concept, the gate structure 136 may include a gate insulation pattern 130, a gate electrode 132 and a hard mask 134 sequentially stacked on the active fin 104a and the isolation layer 102.

In an exemplary embodiment of the inventive concept, the gate electrode 132 may include a metal, e.g., aluminum, copper, or tantalum, or a metal nitride thereof. The gate insulation pattern 130 may include a metal oxide, e.g., hafnium oxide, tantalum oxide, or zirconium oxide. For example, the gate insulation pattern 130 may be formed on sidewalls and bottom of the gate electrode 132. The hard mask 134 may include a nitride, e.g., silicon nitride.

In an exemplary embodiment of the inventive concept, an interface pattern 129 (refer to FIG. 3) may be formed between the active fin 104a and the gate structure 136. The interface pattern 129 may include, e.g., silicon oxide.

The first spacer 114a may be formed on the sidewalls of the gate structure 136 and a top surface of the substrate 100. Thus, the first spacer 114a may be bent at an interface between the sidewalls of the gate structure 136 and the top surface of the substrate 100. The second spacer 116a may be formed on a sidewall of the first spacer 114a. Thus, the sidewalls of the gate structure 136 may be surrounded by the first and second spacers 114a and 116a.

In an exemplary embodiment of the inventive concept, an offset spacer 113 (refer to FIG. 3) may be further formed between the gate structure 136 and the first spacer 114a. The offset spacer 113 may have a thickness less than a thickness of the first spacer 114a. The offset spacer 113 may include, e.g., silicon oxide.

Each of the first and second spacers 114a and 116a may include a material having a dielectric constant lower than the dielectric constant of silicon nitride. In an exemplary embodiment of the inventive concept, each of the first and second spacers 114a and 116a may have a dielectric constant lower than 6, thus a parasitic capacitance between the gate structures 136 may be lower.

In an exemplary embodiment of the inventive concept, the first and second spacers 114a and 116a may include, e.g., silicon oxycarbonitride (SiOCN), and carbon concentrations of the first and second spacers 114a and 116a may be different from each other. Particularly, the first spacer 114a may have a first carbon concentration, and the second spacer 116a may have a second carbon concentration which is less than the first carbon concentration. In an exemplary embodiment of the inventive concept, the first carbon concentration may be in a range of about 4% to about 15%, and the second carbon concentration may be in a range of about 1% to about 12%. Preferably, the first carbon concentration may be in a range of about 10% to about 15%, and the second carbon concentration may be in a range of about 5% to about 10%. In an exemplary embodiment of the inventive concept, a difference between the first and second carbon concentrations may be in a range of about 3% to about 14%.

When the carbon concentration of a SiOCN layer is high, an etch rate of the SiOCN layer may be low in an isotropic etching process, and thus the SiOCN layer may have a high etching resistance during the isotropic etching process, e.g., wet etching process. As the carbon concentration of the SiOCN layer increases, an etch rate of the SiOCN layer may decrease during a wet etching process of polysilicon. The first spacer 114a may have a carbon concentration higher than a carbon concentration of the second spacer 116a, and thus an etch rate of the first spacer 114a may be lower than an etch rate of the second spacer 116a in the wet etching process. When the carbon concentration in the SiOCN layer is greater than about 15%, an etch rate of the SiOCN layer may be too high in an anisotropic etching process, and the SiOCN layer may have a low etching resistance during the anisotropic etching process, e.g., dry etching process, e.g., reactive ion etching process. Thus, preferably, the carbon concentration of the SiOCN layer may be less than about 15%.

When the carbon concentration of the SiOCN is low, an etch rate of the SiOCN layer may be low in an anisotropic etching process, and the SiOCN layer may have a high etching resistance during the anisotropic etching process. As the carbon concentration of the SiOCN decreases, an etch rate of the SiOCN may decrease during a dry etching process of silicon. The second spacer 116a may have a carbon concentration less than a carbon concentration of the first spacer 114a, and thus an etch rate of the second spacer 116a may be lower than an etch rate of the first spacer 114a in the dry etching process.

When the carbon concentration of each of the first and second spacers 114a and 116a is high, a nitrogen concentration of each of the first and second spacers 114a and 116a may be stoichiometrically low. Thus, the first spacer 114a may include a first nitrogen concentration, and the second spacer 116a may include a second nitrogen concentration which is higher than the first nitrogen concentration. In exemplary embodiments, the first nitrogen concentration may be in a range of about 10% to about 40%, and the second nitrogen concentration may be in a range of about 13% to 43%.

In an exemplary embodiment of the inventive concept, each of the first and second spacers 114a and 116a may have a silicon concentration in a range of about 33% to about 35%. In an exemplary embodiment of the inventive concept, the silicon concentrations of the first and second spacers 114*a* and 116*a* may be substantially equal to each other.

A dielectric constant of each of the first and second spacers 114*a* and 116*a* may depend on an oxygen concentration of each of the first and second spacers 114*a* and 116*a*. When the oxygen concentrations of the first and second spacers 114*a* and 116*a* are substantially equal to each other, the dielectric constants of the first and second spacers 114*a* and 116*a* may be substantially equal to each other.

As the oxygen concentration of each of the first and second spacers 114*a* and 116*a* increases, the dielectric constant of each of the first and second spacers 114*a* and 116*a* may decrease. However, when the oxygen concentration increases, an etch selectivity between the first and second spacers 114*a* and 116*a* and silicon, and/or polysilicon, may decrease. Thus, each of the first and second spacers 114*a* and 116*a* may have such an oxygen concentration that the SiOCN layer may be stoichiometrically stable and may have a high etching selectivity with respect to silicon and/or polysilicon. In an exemplary embodiment of the inventive concept, the oxygen concentration of each of the first and second spacers 114*a* and 116*a* may be in a range of about 20% to about 40%. In an exemplary embodiment of the inventive concept, the oxygen concentrations of the first and second spacers 114*a* and 116*a* may be substantially equal to each other. Alternatively, the oxygen concentrations of the first and second spacers 114*a* and 116*a* may be different from each other. In an exemplary embodiment of the inventive concept, a difference between the dielectric constants of the first and second spacers 114*a* and 116*a* may be less than about 0.5, however, the difference may not be limited thereto.

The gate structure 136 and the first and second spacers 114*a* and 116*a* may be formed on the second pattern of the active fin 104*a*. The recess 118 may be disposed between the second spacers 116*a*. An active fin structure may be formed including the active fin 104*a* and the recess 118.

The epitaxial pattern 120 may be formed in the recess 118. The epitaxial pattern 120 may protrude from the active fin 104*a* in the recess 118 in the second direction. In an exemplary embodiment of the inventive concept, the epitaxial pattern 120 may have a cross-section taken along the second direction, in which the shape of the epitaxial pattern 120 may be pentagon, hexagon, or rhombus.

In an exemplary embodiment of the inventive concept, the epitaxial pattern 120 disposed in the second direction may be connected to each other and merged into a single structure. The epitaxial pattern 120 may serve as source/drain regions of a FinFET, and may be doped with impurities. The epitaxial pattern 120 may include silicon or silicon-germanium. When an n-type FinFET is formed, the epitaxial pattern 120 may include silicon, and may be doped with n-type impurities. When a p-type FinFET is formed, the epitaxial pattern 120 may include silicon-germanium, and may be doped with p-type impurities.

In an exemplary embodiment of the inventive concept, a metal silicide pattern may be formed on the epitaxial pattern 120.

The first and second insulating interlayers 122 and 138 may be formed on the gate structure 136, the first and second spacers 114*a* and 116*a* and the epitaxial pattern 120. The first insulating interlayer 122 may fill a gap between the gate structures 136. The second insulating interlayer 138 may be formed on the first insulating interlayer 122. The first and second insulating interlayers 122 and 138 may include substantially the same material. The first and second insulating interlayers 122 and 138 may include, e.g., silicon oxide.

The contact structure 146 may penetrate through the first and second insulating interlayers 122 and 138, and may contact an upper surface of the epitaxial pattern 120. The contact structure 146 may include a barrier pattern 142 and a metal pattern 144. The barrier pattern 142 may include, e.g., titanium, titanium nitride, tungsten nitride, tantalum, tantalum nitride, TiAlN, cobalt, ruthenium, or nickel. The barrier pattern 142 may have a single layer structure or a multi-layered structure. The metal pattern 144 may include, e.g., tungsten, copper, or aluminum.

In an exemplary embodiment of the inventive concept, the contact structure 146 may partially contact the sidewalls of the second spacer 116*a*.

As described above, damage of the first spacer 114*a* may be minimized during the isotropic etching process, and damage of the second spacer 116*a* may be minimized during the anisotropic etching process. Defects of the semiconductor device due to the damage of a spacer structure including the first and second spacers 114*a* and 116*a* may be minimized.

FIGS. 4 to 14 are cross-sectional views illustrating stages of a method of manufacturing a semiconductor device according to an exemplary embodiment of the inventive concept. Particularly, FIG. 4 includes cross-sectional views taken along lines I-I' and II-II', respectively, of FIG. 1, and each of FIGS. 5 to 14 includes cross-sectional views taken along lines I-I', II-II' and III-III', respectively, of FIG. 1.

Referring to FIG. 4, an upper portion of a substrate 100 may be partially removed to form a trench extending in a first direction, and an isolation layer 102 may be formed on the substrate 100 to fill a lower portion of the trench.

Before forming the trench, impurities may be implanted into the substrate 100 to form a well region.

In an exemplary embodiment of the inventive concept, the isolation layer 102 may be formed by: forming an insulation layer on the substrate 100 to sufficiently fill the trench, planarizing the insulation layer until a top surface of the substrate 100 may be exposed, and removing an upper portion of the insulation layer to expose an upper portion of the trench. The insulation layer may be formed of an oxide, e.g., silicon oxide.

As the isolation layer 102 is formed, a preliminary active fin structure including a plurality of preliminary active fins 104 may be formed on the substrate 100, and each of the preliminary active fins 104 may extend in the first direction. In an exemplary embodiment of the inventive concept, the preliminary active fins 104 may be formed in a second direction substantially perpendicular to the first direction.

Figure 5:
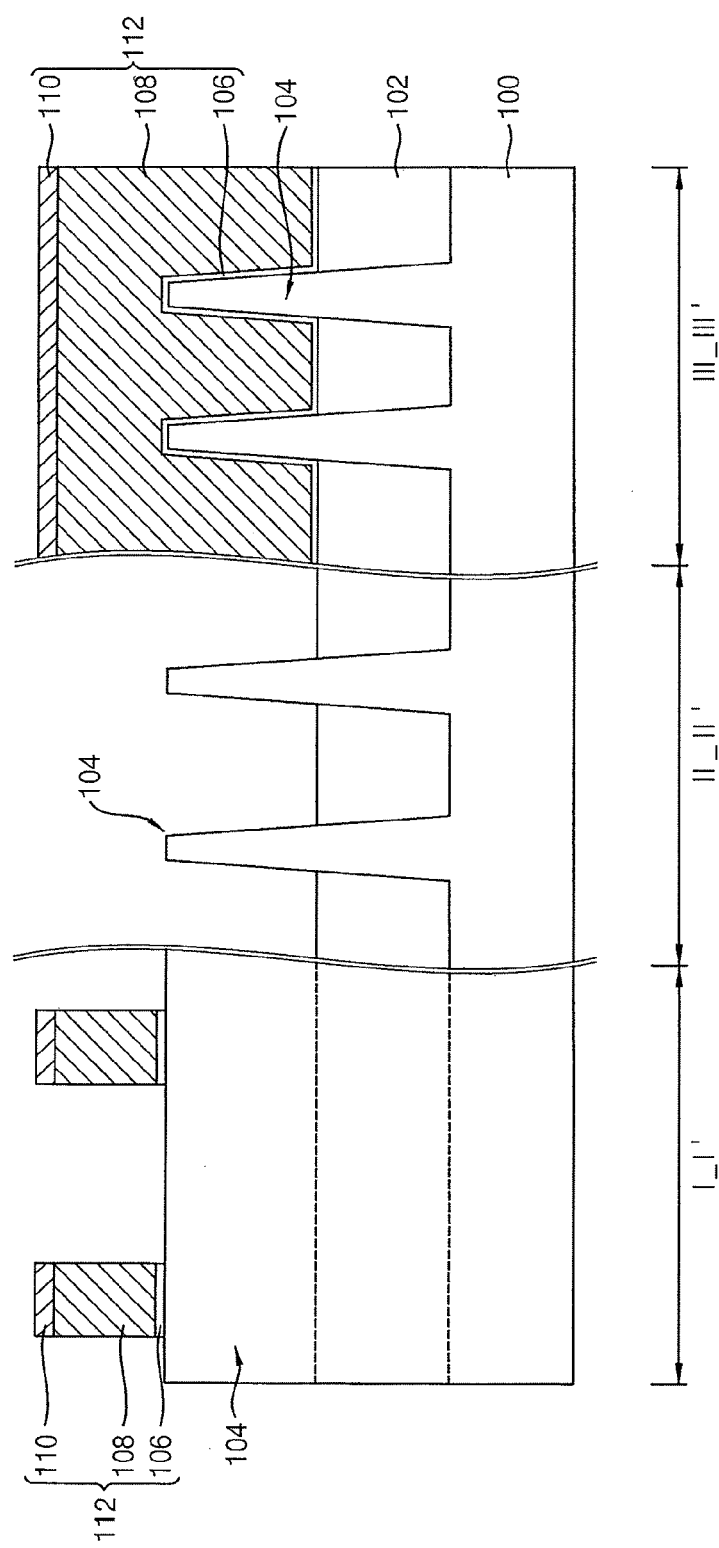

Referring to FIG. 5, a plurality of dummy gate structures 112 may be formed on the substrate 100. Particularly, dummy gate structures 112 may be formed by: sequentially stacking a dummy gate insulation layer, a dummy gate electrode layer and a hard mask layer on the preliminary active fins 104 and the isolation layer 102, patterning the hard mask layer by a photolithography process using a photoresist pattern as an etching mask to form a first hard mask 110, and sequentially etching the dummy gate electrode layer and the dummy gate insulation layer using the first hard mask 110 as an etching mask. Thus, each of the dummy gate structures 112 may be formed to include a dummy gate insulation pattern 106, a dummy gate electrode 108 and the first hard mask 110 sequentially stacked.

The dummy gate insulation layer may be formed of an oxide, e.g., silicon oxide, the dummy gate electrode layer may be formed of, e.g., polysilicon, and the hard mask layer may be formed of a nitride, e.g., silicon nitride. The dummy gate insulation layer may be formed by a chemical vapor deposition (CVD) process, or an atomic layer deposition (ALD) process. Alternatively, the dummy gate insulation layer may be formed by a thermal oxidation process on an upper portion of the substrate 100. The dummy gate electrode layer and the hard mask layer may also be formed by a CVD process, or an ALD process.

In an exemplary embodiment of the inventive concept, each of the dummy gate structures 112 may be formed to extend in the second direction on the preliminary active fins 104 and the isolation layer 102, and the plurality of dummy gate structures 112 may be formed at a given distance from each other in the first direction.

Figure 6:
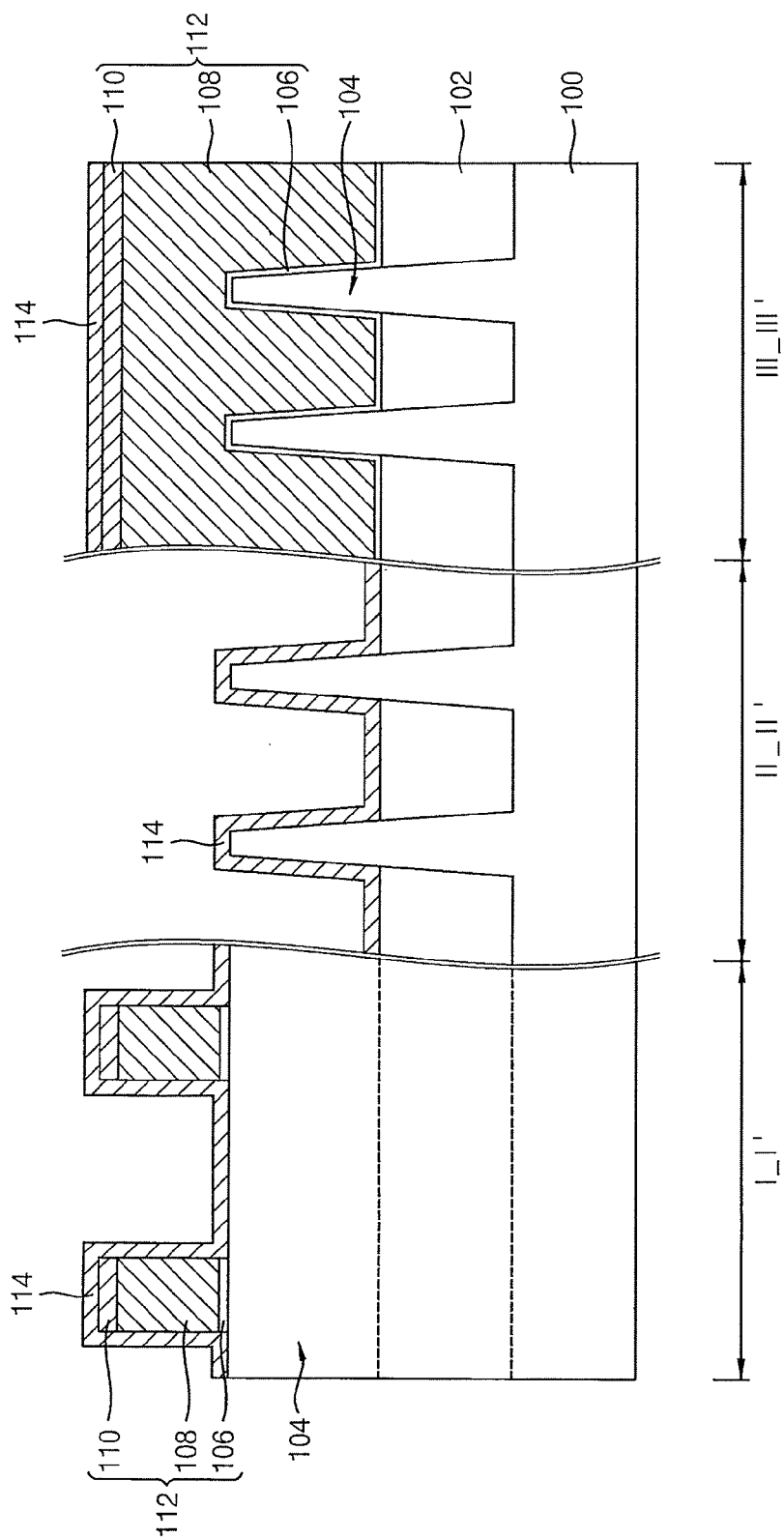

Referring to FIG. 6, a first spacer layer 114 may be formed on the dummy gate structures 112, the isolation layer 102 and the preliminary active fins 104.

In an exemplary embodiment of the inventive concept, before forming the first spacer layer 114, an offset spacer layer may be formed on the dummy gate structures 112, the isolation layer 102 and the preliminary active fins 104. The offset spacer layer may have a thickness less than a thickness of the first spacer layer 114. The offset spacer layer may include, e.g., silicon oxide. The offset spacer layer may be formed by a CVD process, an ALD process, or a thermal oxidation process.

The first spacer layer 114 may include a material having a dielectric constant lower than the dielectric constant of silicon nitride. In an exemplary embodiment of the inventive concept, the first spacer layer 114 may include a material having a dielectric constant lower than about 6.

In an exemplary embodiment of the inventive concept, the first spacer layer 114 may include SiOCN, and may have a first carbon concentration and a first nitrogen concentration. For example, the first carbon concentration may be in a range of about 4% to about 15%, and the first nitrogen concentration may be in a range of about 10% to about 40%. Also, the first spacer layer 114 may have a silicon concentration in a range of about 33% to about 35% and an oxygen concentration in a range of about 20% to about 40%.

In an exemplary embodiment of the inventive concept, the first spacer layer 114 may be formed by an ALD process. Particularly, source gases such as silicon source gas, oxygen source gas, nitrogen source gas and carbon source gas may be sequentially and continuously supplied into a process chamber to form the first spacer layer 114. The silicon source gas may include, e.g., chlorosilane. The oxygen source gas may include, e.g., $O_2$. The nitrogen source gas may include, e.g., $NH_3$. The carbon source gas may include, e.g., $C_3H_6$. By controlling at least one of a flow rate and a supply time of each of the source gases, concentrations of silicon, oxygen, nitrogen and carbon of the first spacer layer 114 may be controlled.

In some exemplary embodiments of the inventive concept, the first spacer layer 114 may be formed by a CVD process or a physical vapor deposition (PVD) process.

Figure 7:
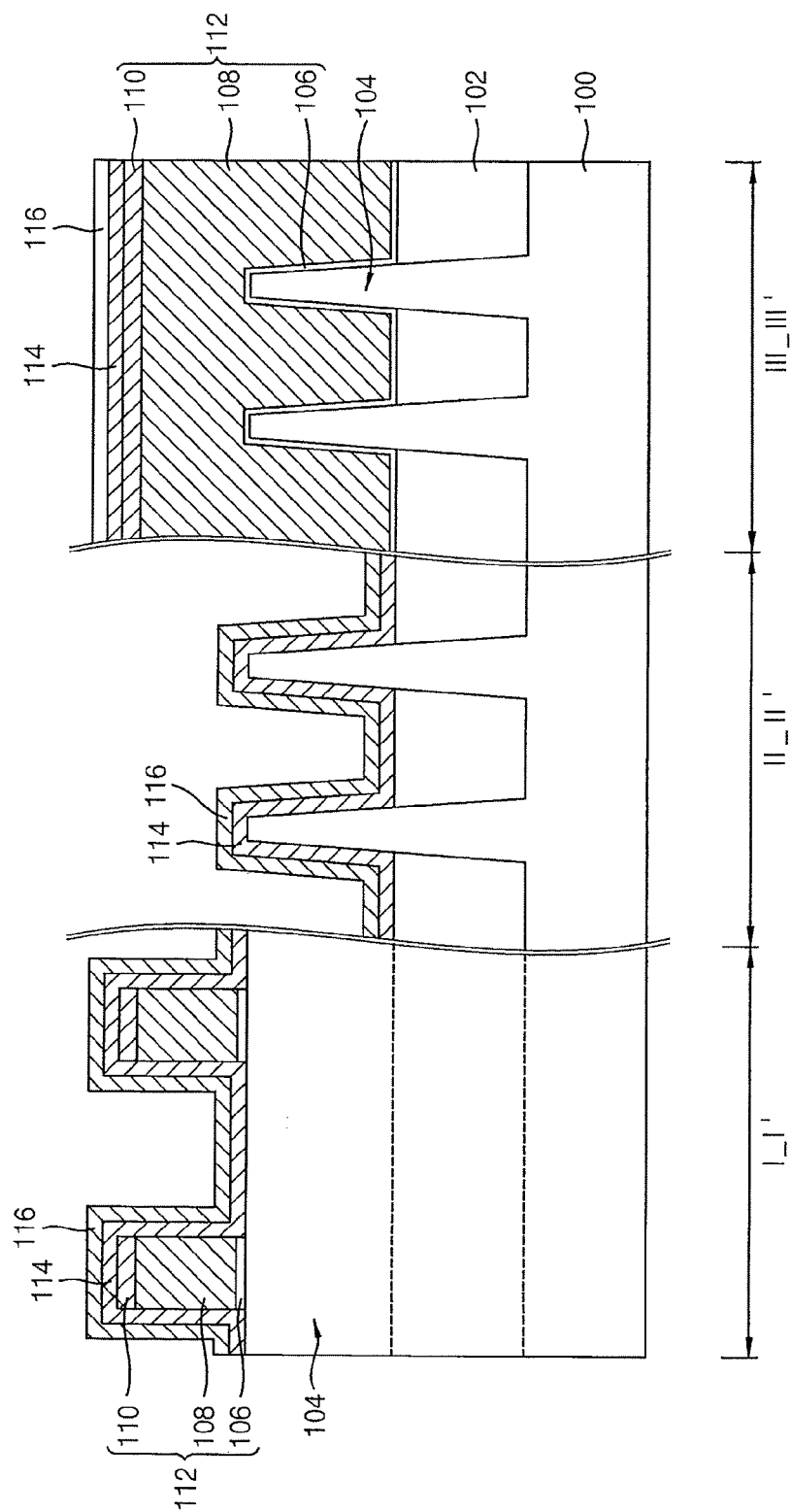

Referring to FIG. 7, a second spacer layer 116 may be formed on the first spacer layer 114. The second spacer layer 116 may include SiOCN, and may have a second carbon concentration which is lower than the first carbon concentration, and a second nitrogen concentration which is higher than the first nitrogen concentration. For example, the second carbon concentration may be in a range of about 1% to about 12%, and the second nitrogen concentration may be in a range of about 13% to about 43%. Also, the second spacer layer 116 may have a silicon concentration in a range of about 33% to about 35% and an oxygen concentration in a range of about 20% to about 40%.

In an exemplary embodiment of the inventive concept, the silicon concentration of the second spacer layer 116 may be substantially equal to the silicon concentration of the first spacer layer 114. In an exemplary embodiment of the inventive concept, the oxygen concentration of the second spacer layer 116 may be substantially equal to the oxygen concentration of the first spacer layer 114. The dielectric constant of each of the first and second spacer layers 114 and 116 may depend on the oxygen concentration of each of the first and second spacer layers 114 and 116.

In an exemplary embodiment of the inventive concept, the first and second spacer layers 114 and 116 may be formed in-situ. In some exemplary embodiments of the inventive concept, the first and second spacer layers 114 and 116 may be formed ex-situ.

For example, the second spacer layer 116 may be formed by an ALD process, and forming the first and second spacer layers 114 and 116 may be performed in-situ. Particularly, source gases such as silicon source gas, oxygen source gas, nitrogen source gas, and carbon source gas may be sequentially and continuously supplied into a process chamber to form the second spacer layer 116. At least one of a flow rate and a supply time of the carbon source gas during the formation of the second spacer layer 116 may be less than the corresponding at least one of a flow rate and a supply time of the carbon source gas during the formation of the first spacer layer 114. Also, at least one of a flow rate and a supply time of the nitrogen source gas during the formation of the second spacer layer 116 may be greater than the corresponding at least one of a flow rate and a supply time of the nitrogen source gas during the formation of the first spacer layer 114.

An etching rate of the first spacer layer 114 may be less than an etching rate of the second spacer layer 116 during a wet etching process of polysilicon. Also, an etching rate of the second spacer layer 116 may be less than an etching rate of the first spacer layer 114 during a dry etching process of silicon.

Figure 8:
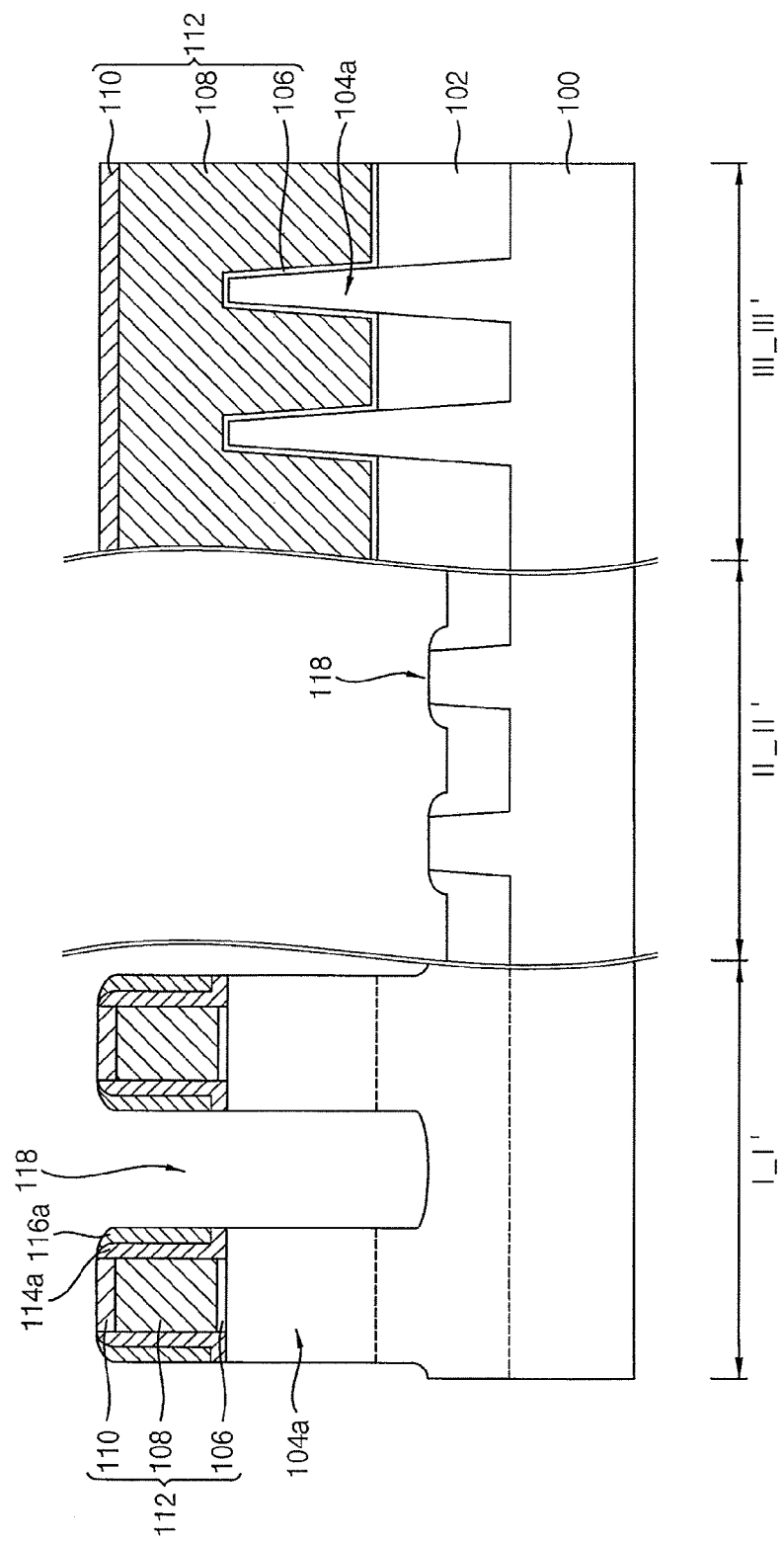

Referring to FIG. 8, the first and second spacer layers 114 and 116 may be anisotropically etched to form first and second spacers 114a and 116a, respectively, on sidewalls of each of the dummy gate structures 112. That is, the first spacer 114a may be formed on the sidewalls of each of the dummy gate structures 112, and the second spacer 116a may be formed on the sidewalls of the first spacer 114a. Thus, outer sidewalls of the second spacer 116a may be exposed.

The preliminary active fin 104 may be anisotropically etched using the dummy gate structures 112 and the second spacers 116a as an etching mask to form an active fin structure including an active fin 104a and a recess 118. A width of the recess 118 may be determined by a distance between the second spacers 116a.

In an exemplary embodiment of the inventive concept, a bottom of the recess 118 may be lower than the top surface of the isolation layer 102 under the dummy gate structure 112.

In an exemplary embodiment of the inventive concept, an anisotropic etching process for forming the first and second spacers 114a and 116a and the recess 118 may be performed in-situ. That is, the preliminary active fin 104 including silicon may be anisotropically etched to form the recess 118. The anisotropic etching process may include a dry etching process. During the anisotropic etching of the preliminary active fin 104, the second spacer 116a may be exposed so that a surface of the second spacer 116a may be etched or damaged, and the sidewalls of the dummy gate structures 112 may be exposed.

The second spacer 116a may have a high etching resistance during the anisotropic etching of the silicon. Thus, damage of the second spacer 116a may be minimized in the anisotropic etching of the preliminary active fin 104 including silicon. That is, the second spacer 116a may encapsulate the sidewalls of the dummy gate structures 112, so that the sidewalls of the dummy gate structures 112 may not be exposed. Also, the width of the second spacer 116a may not be changed so that the width of the recess 118 may be uniform.

Figure 9:
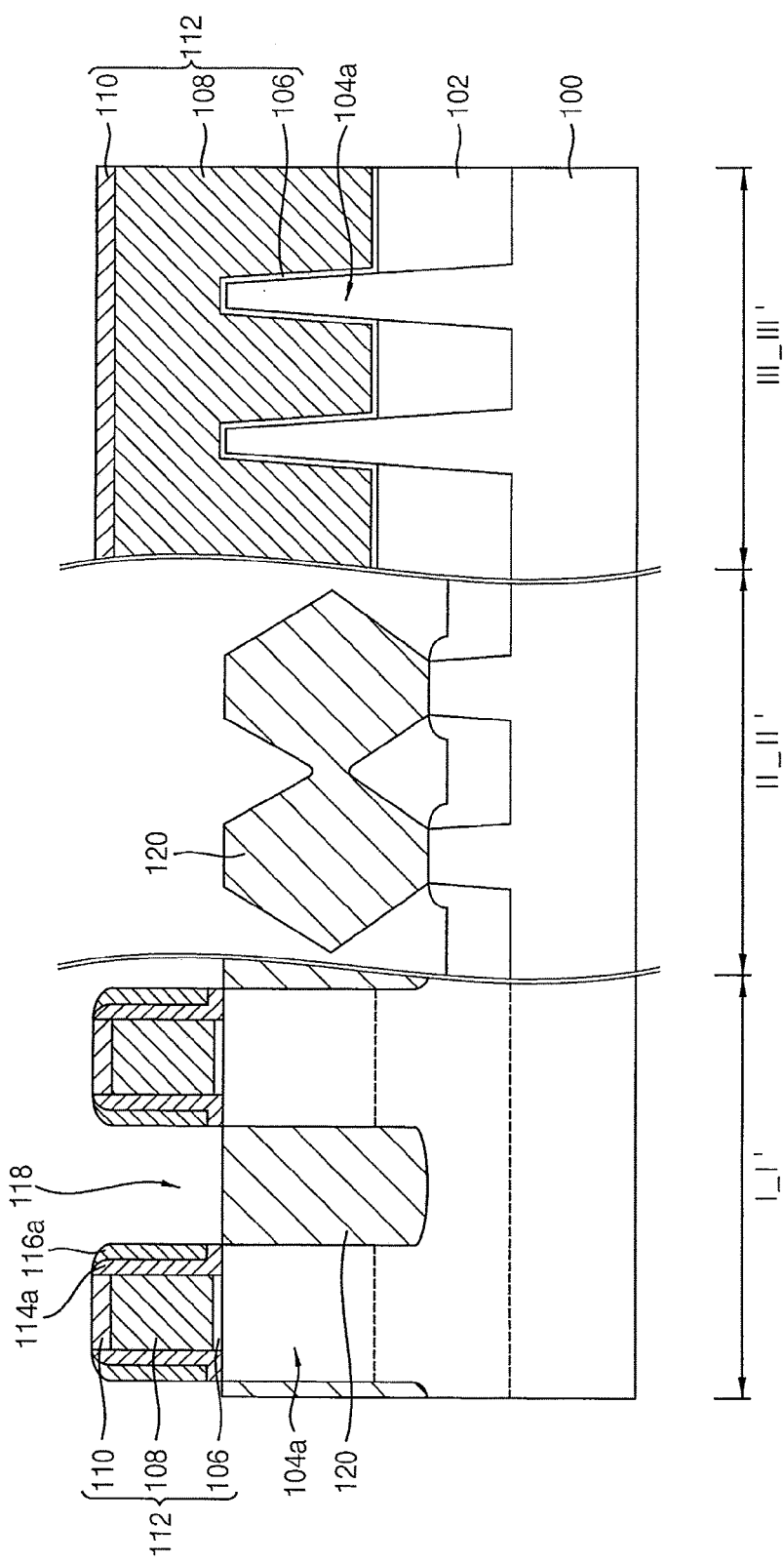

Referring to FIG. 9, an epitaxial pattern 120 may be formed to fill the recess 118. In an exemplary embodiment of the inventive concept, a plurality of epitaxial patterns 120 may be formed in the second direction, and the epitaxial patterns 120 disposed in the second direction may be connected to each other and merged into a single layer.

In an exemplary embodiment of the inventive concept, a selective epitaxial growth (SEG) process may be performed using a surface of the active fin 104a exposed by the recess 118 as a seed to form the epitaxial pattern 120.

The epitaxial pattern 120 may be grown both in a vertical direction and a lateral direction. Thus, the epitaxial pattern 120 may protrude from the active fin 104a in the recess 118 in the second direction. In an exemplary embodiment of the inventive concept, the epitaxial pattern 120 may have a cross-section taken along the second direction, in which the shape of the epitaxial pattern 120 may be pentagon, hexagon, or rhombus.

In an exemplary embodiment of the inventive concept, impurities may be doped in the epitaxial pattern 120, and the SEG process and the doping process may be performed in-situ. The merged epitaxial patterns 120 arranged in the second direction may serve as source/drain regions of a FinFET.

In an exemplary embodiment of the inventive concept, the epitaxial pattern 120 may include silicon-germanium or silicon. For example, when the semiconductor device is a p-type FinFET, the epitaxial pattern 120 may include silicon-germanium. For example, when the semiconductor device is an n-type FinFET, the epitaxial pattern 120 may include silicon.

In an exemplary embodiment of the inventive concept, after forming the epitaxial pattern 120, a doping process and a thermal process may be further performed.

Figure 10:
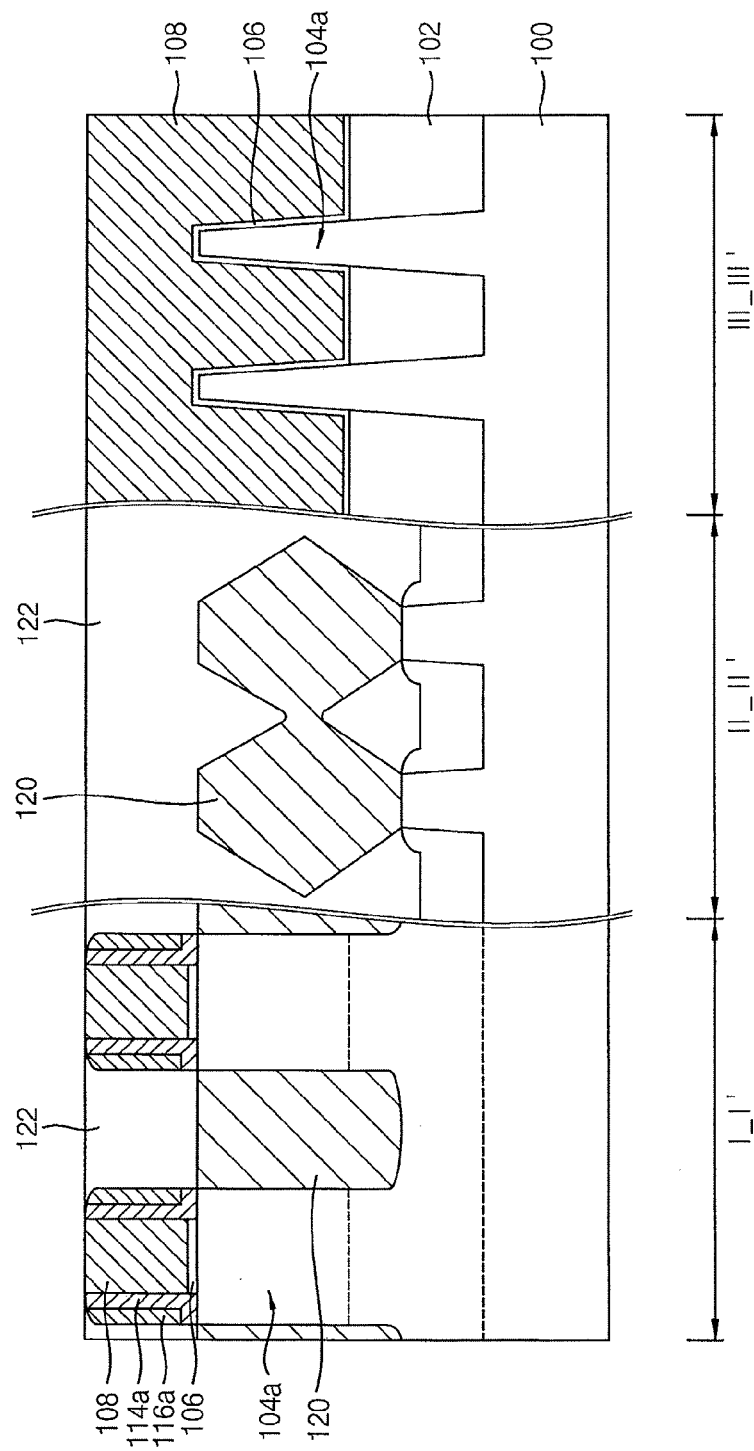

Referring to FIG. 10, a first insulating interlayer 122 covering the dummy gate structures 112, the first and second spacers 114a and 116a, the epitaxial pattern 120 and the isolation layer 102 may be formed on the substrate 100, and an upper portion of the insulating interlayer 122 may be planarized until top surfaces of the dummy gate structures 112 are exposed. The first insulating interlayer 122 may include, e.g., silicon oxide. In an exemplary embodiment of the inventive concept, the planarization process may be performed by a chemical mechanical polishing (CMP) process and/or an etch back process.

In an exemplary embodiment of the inventive concept, the first hard mask 110 may be removed by the planarization process. In some exemplary embodiments of the inventive concept, the first hard mask 110 may partially remain on the dummy gate electrode 108.

Figure 11:
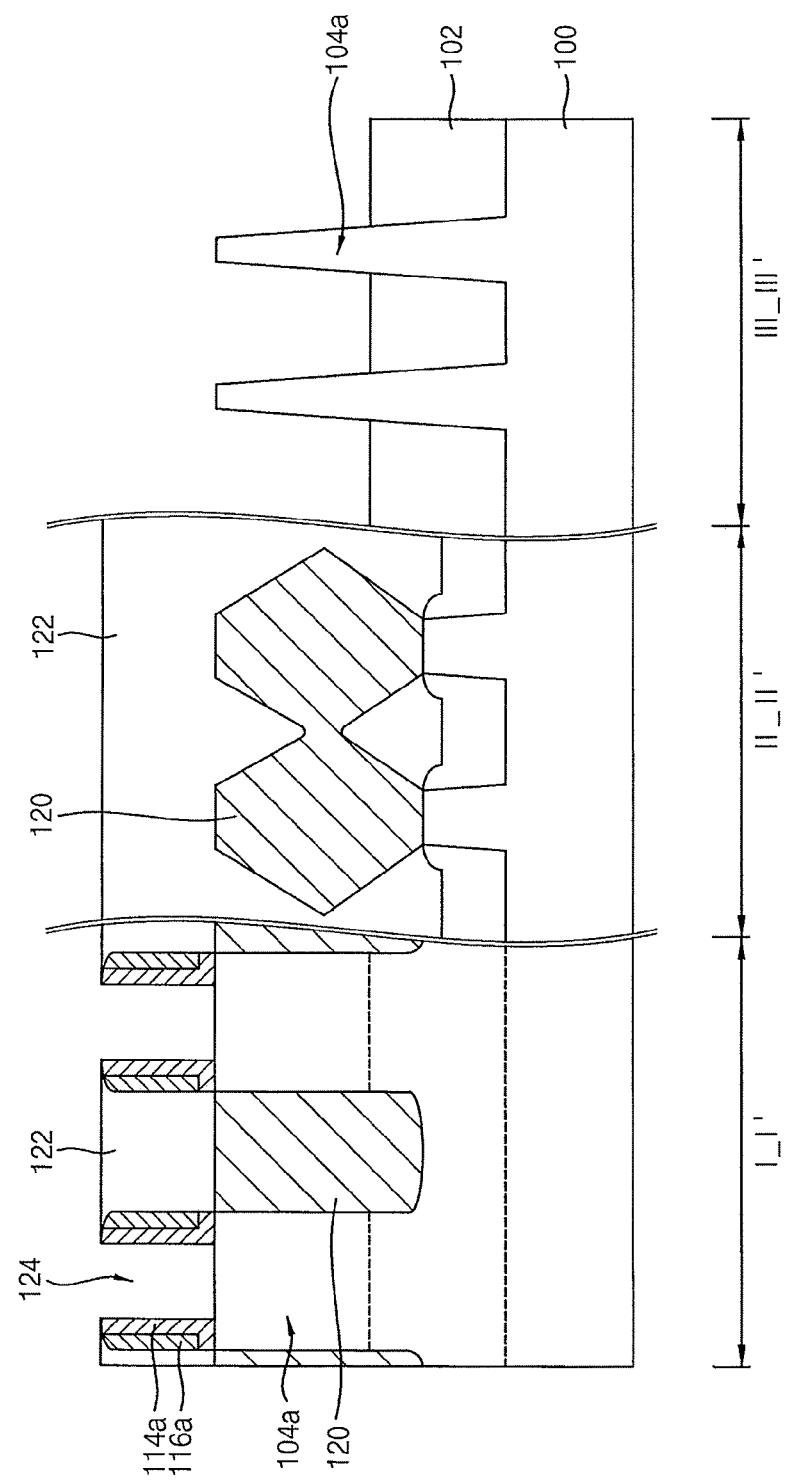

Referring to FIG. 11, the dummy gate electrode 108 and the dummy gate insulation pattern 106 may be isotropically etched to form an opening 124. The active fin 104a and the isolation layer 102 may be exposed by the opening 124. The isotropic etching process may include a wet etching process.

When the dummy gate electrode 108 and the dummy gate insulation pattern 106 are removed, an inner wall of the first spacer 114a may be exposed. Thus, the inner wall of the first spacer 114a may contact an etchant during the isotropic etching process so that the surface of the first spacer 114a may be damaged. However, the first spacer 114a may have a high resistance towards an etchant for polysilicon. Thus, during the isotropic etching of the dummy gate electrode 108 including polysilicon, the first spacer 114a may not be etched or damaged. Also, the width of the first spacer 114a may not be changed so that the width of the opening 124 may be uniform.

In an exemplary embodiment of the inventive concept, an interface pattern may be formed on the active fin 104a exposed by the opening 124. The interface pattern may include, e.g., silicon oxide formed by a thermal oxidation process.

Figure 12:
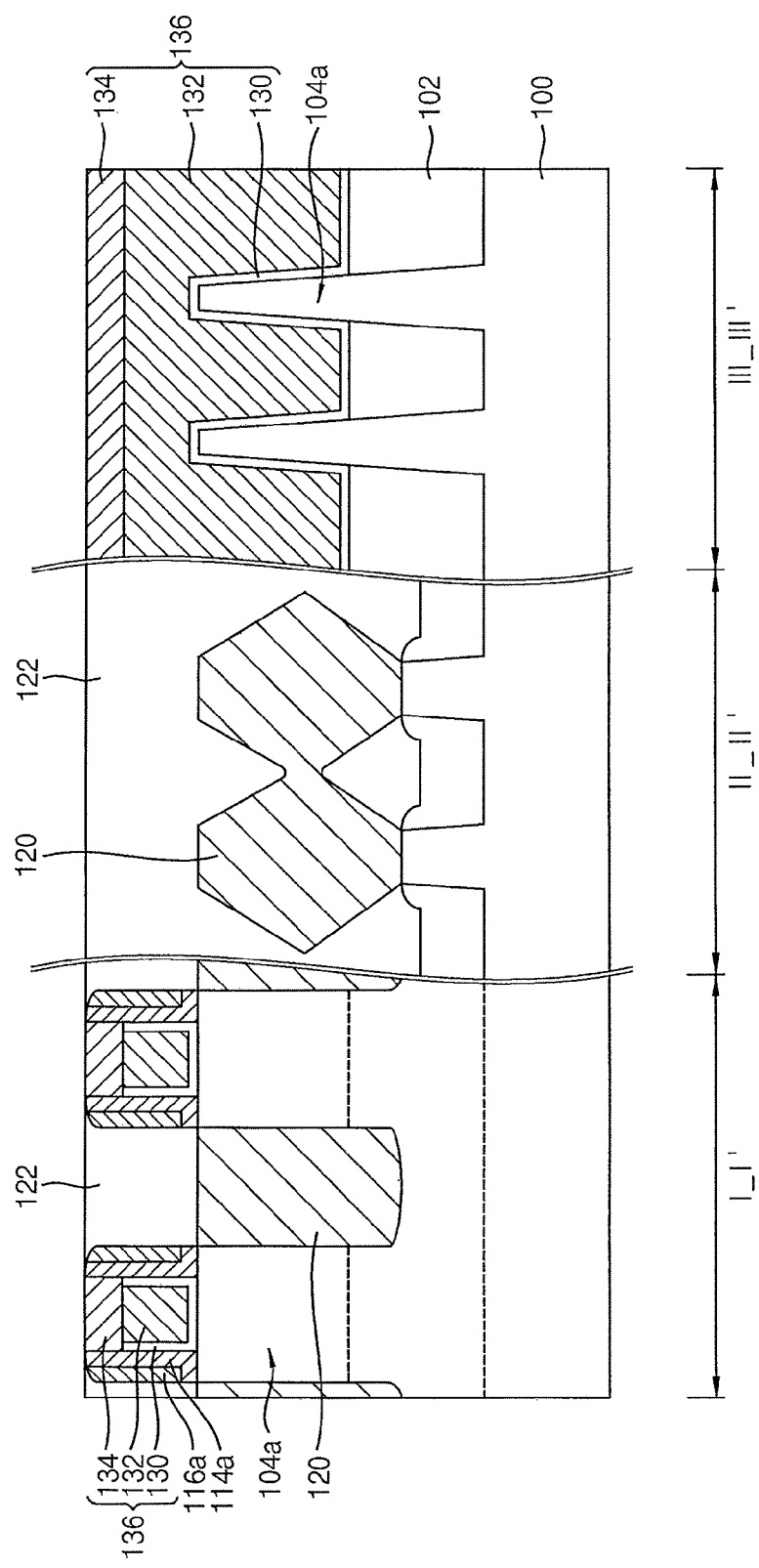

Referring to FIG. 12, a gate structure 136 may be formed to fill the opening 124. The gate structure 136 may include a gate insulation pattern 130, a gate electrode 132 and a hard mask 134 sequentially stacked. Particularly, a high-k dielectric layer may be formed on sidewalls of the opening 124 and top surfaces of the interface pattern and the first insulating interlayer 122, and a gate electrode layer may be formed on the high-k dielectric layer to fill remaining portions of the opening 124.

The high-k dielectric layer may be formed of a metal oxide having a high dielectric constant, e.g., hafnium oxide, tantalum oxide, or zirconium oxide. The gate electrode layer may be formed of a material having a low electrical resistance, e.g., a metal such as aluminum, copper, or tantalum, or a metal nitride thereof, by an ALD process, or a PVD process.

The gate electrode layer and the high-k dielectric layer may be planarized until the top surface of the first insulating interlayer 122 may be exposed, and an upper portion of the gate electrode layer may be partially etched. Thus, the gate insulation pattern 130 may be formed on an inner wall of the opening 124, and the gate electrode 132 may be formed on the gate insulation pattern 130 to fill a lower portion of the opening 124. In an exemplary embodiment of the inventive concept, the planarization process may be performed by a CMP process and/or an etch back process. A hard mask layer may be formed on the gate electrode 132 to fill the remaining portion of the opening 124, and the hard mask layer may be planarized until the top surface of the first insulating interlayer 122 may be exposed to form the hard mask 134. Thus, the gate insulation pattern 130, the gate electrode 132 and the hard mask 134 sequentially stacked may form the gate structure 136.

Figure 13:
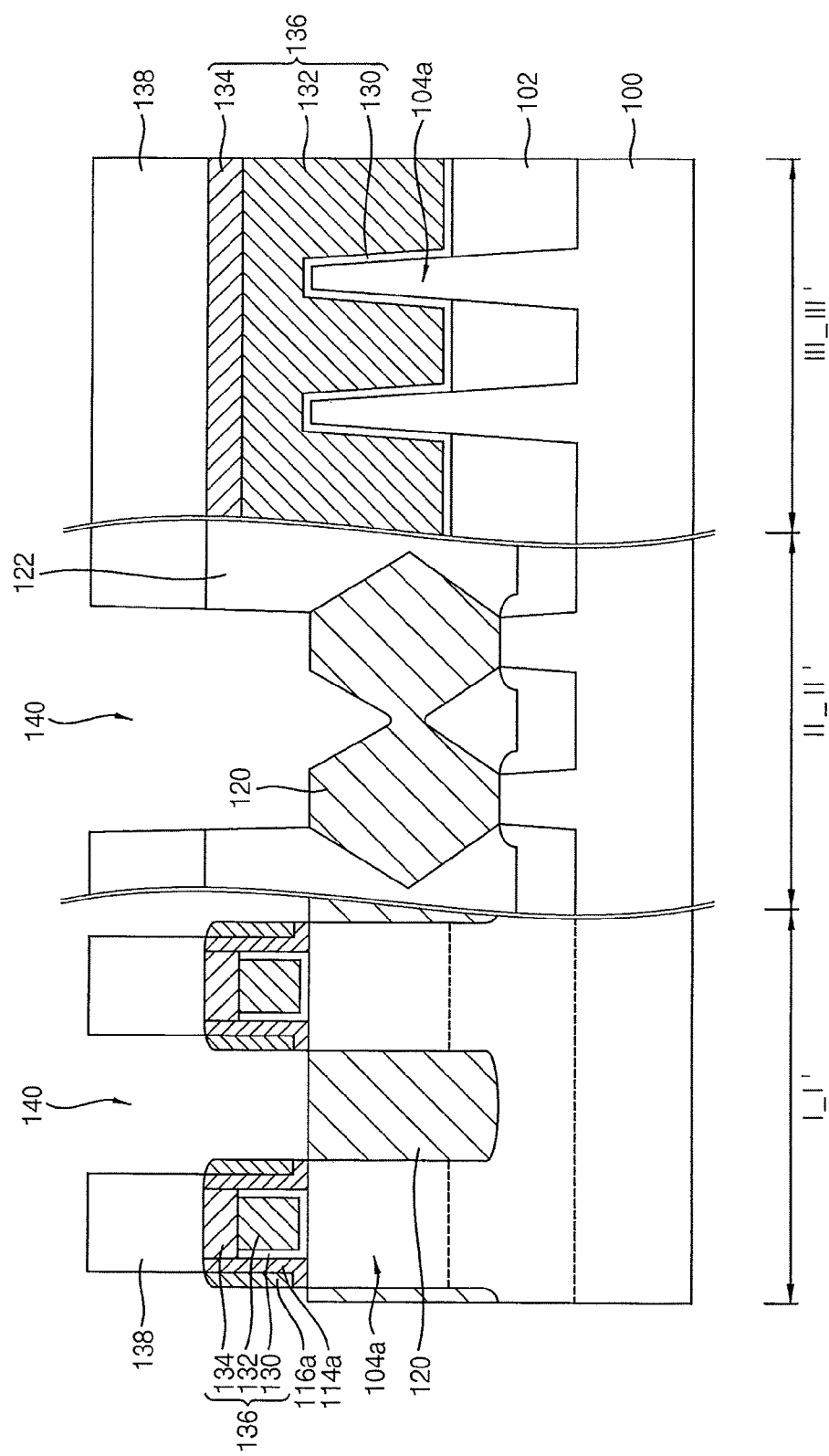

Referring to FIG. 13, a second insulating interlayer 138 may be formed on the first insulating interlayer 122. In an exemplary embodiment of the inventive concept, the second insulating interlayer 138 may include a material substantially the same as the material of the first insulating interlayer 122.

The first and second insulating interlayers 122 and 138 may be anisotropically etched to form a contact hole 140 exposing the epitaxial pattern 120. The anisotropic etching process may include a dry etching process. The contact hole 140 may be self-aligned with the second spacer 116a. That is, a sidewall of the second spacer 116a may be exposed by the contact hole 140. The second spacer 116a may have a relatively low carbon concentration, so that damages of the second spacer 116a may be minimized during the anisotropic etching process.

Figure 14:
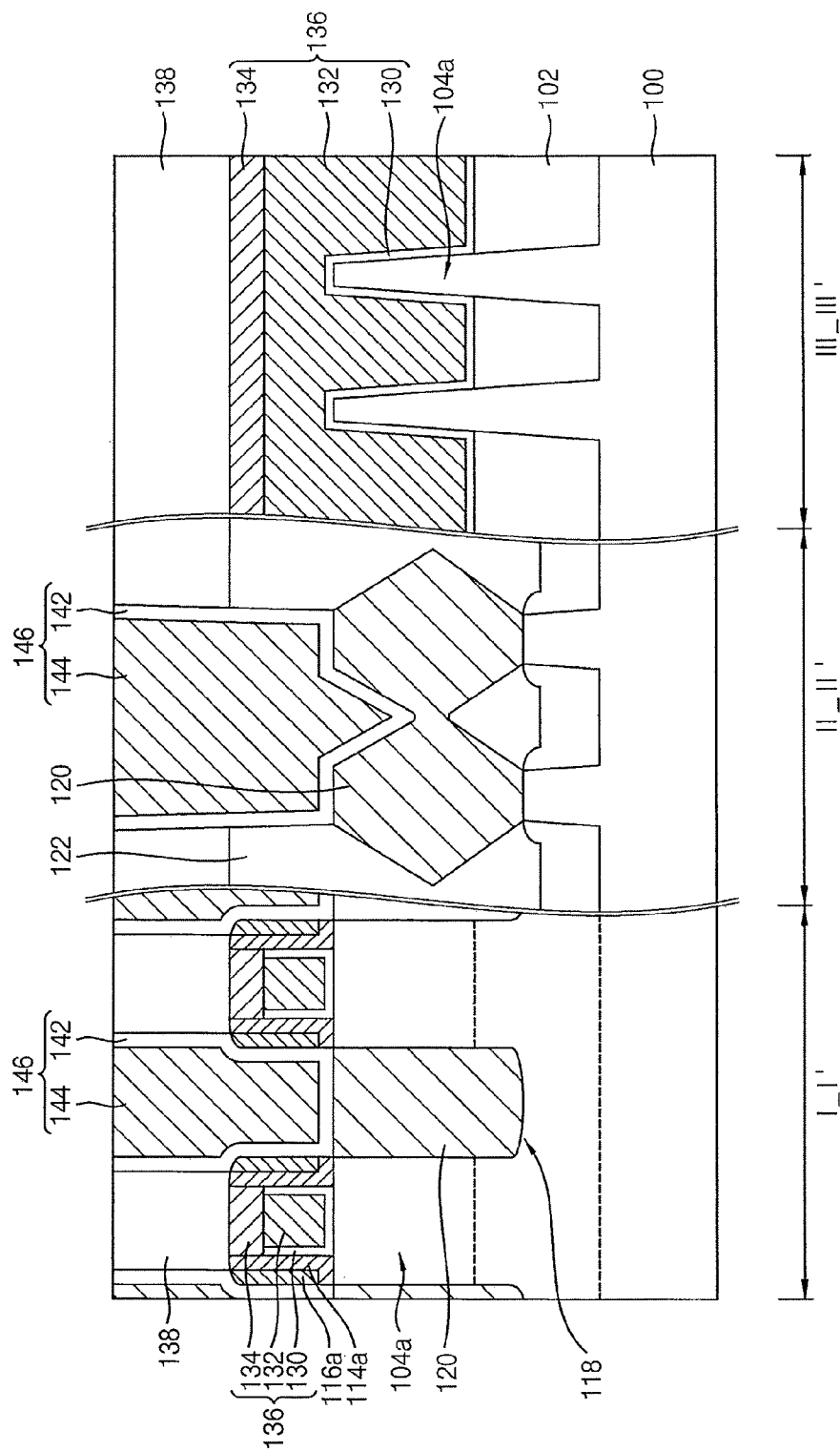

Referring to FIG. 14, a contact structure 146 may be formed to fill the contact hole 140.

In an exemplary embodiment of the inventive concept, a barrier layer may be conformally formed on sidewalls and bottom of the contact hole 140 and sidewalls of the second insulating interlayer 138. The barrier layer may be formed of, e.g., titanium, titanium nitride, tungsten nitride, tantalum, tantalum nitride, TiAlC, cobalt, ruthenium, or nickel. The barrier layer may be formed to have a single layer structure or a multi-layered structure.

A metal layer may be formed on the barrier layer to sufficiently fill remaining portions of the contact hole 140. The metal layer may be formed of, e.g., tungsten, copper, or aluminum.

The metal layer and the barrier layer may be planarized until the a top surface of the second insulating interlayer 138 may be exposed to form the contact structure 146 including a barrier pattern 142 and a metal pattern 144 in the contact hole 140. In an exemplary embodiment of the inventive concept, the planarization process may be performed by a CMP process and/or an etch back process.

A conductive pattern may be further formed on the contact structure 146. In an exemplary embodiment of the inventive concept, the conductive pattern may include, e.g., a pad electrode, or a conductive line.

As described above, the first and second spacers 114a and 116a may be formed of SiOCN, and may have different carbon concentrations from each other. The damage of the second spacer 116a may be minimized during the anisotropic etching process, and the damage of the first spacer 114a may be minimized during the isotropic etching process. Thus, the semiconductor device having a high reliability may be manufactured.

Figure 15:
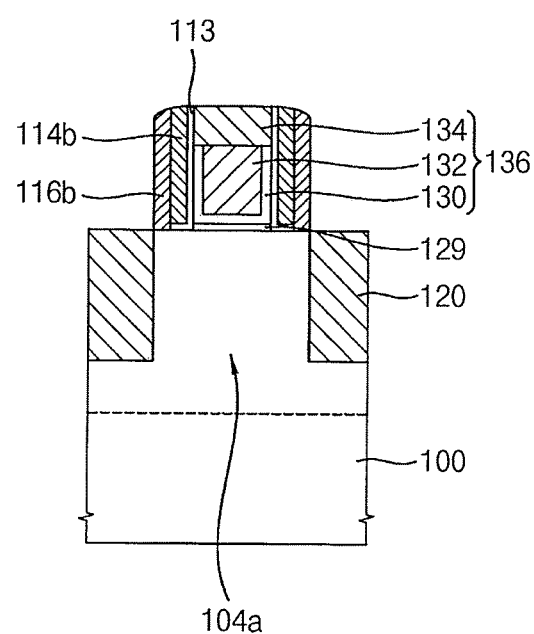
FIG. 15 is a cross-sectional view illustrating a gate structure in a semiconductor device according to an exemplary embodiment of the inventive concept.

FIG. 15 is a cross-sectional view illustrating a gate structure in a semiconductor device according to an exemplary embodiment of the inventive concept. The semiconductor device shown in FIG. 15 may be substantially the same as the semiconductor device of FIGS. 1, 2 and 3, except for shapes of the first spacer and the second spacer. Thus, like reference numerals refer to like elements, and detailed descriptions thereon are omitted herein.

Referring to FIG. 15, the first spacer 114b may be only formed on sidewalls of each of the gate structure 136. The second spacer 116b may be formed on sidewalls of the first spacer 114b. The first spacer 114b may not have a bent portion at an interface between a top surface of the substrate and the sidewalls of the gate structure 136.

Figure 16:
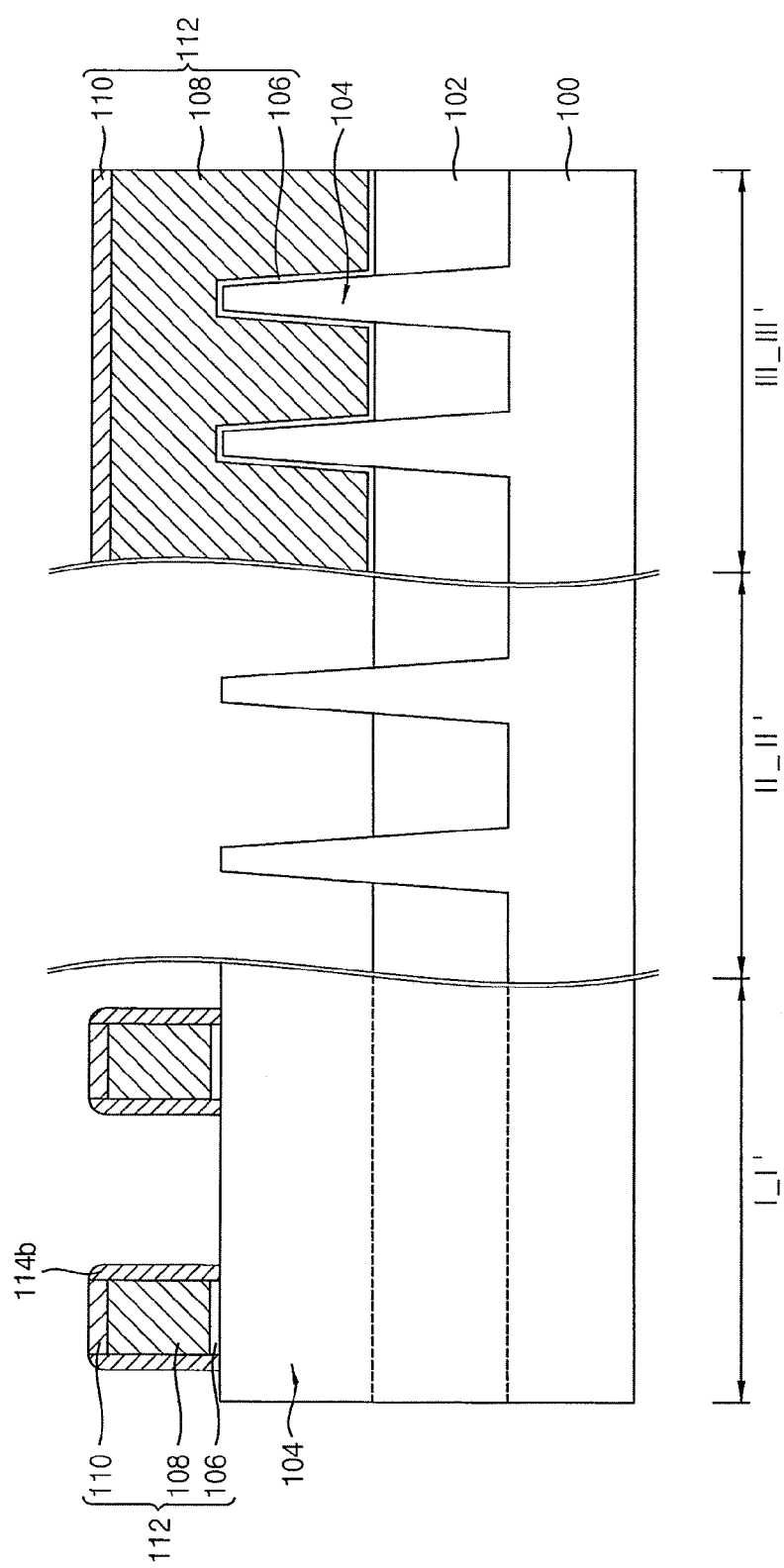
FIGS. 16 to 18 are cross-sectional views illustrating stages of a method of manufacturing a semiconductor device according to an exemplary embodiment of the inventive concept.
Figure 17:
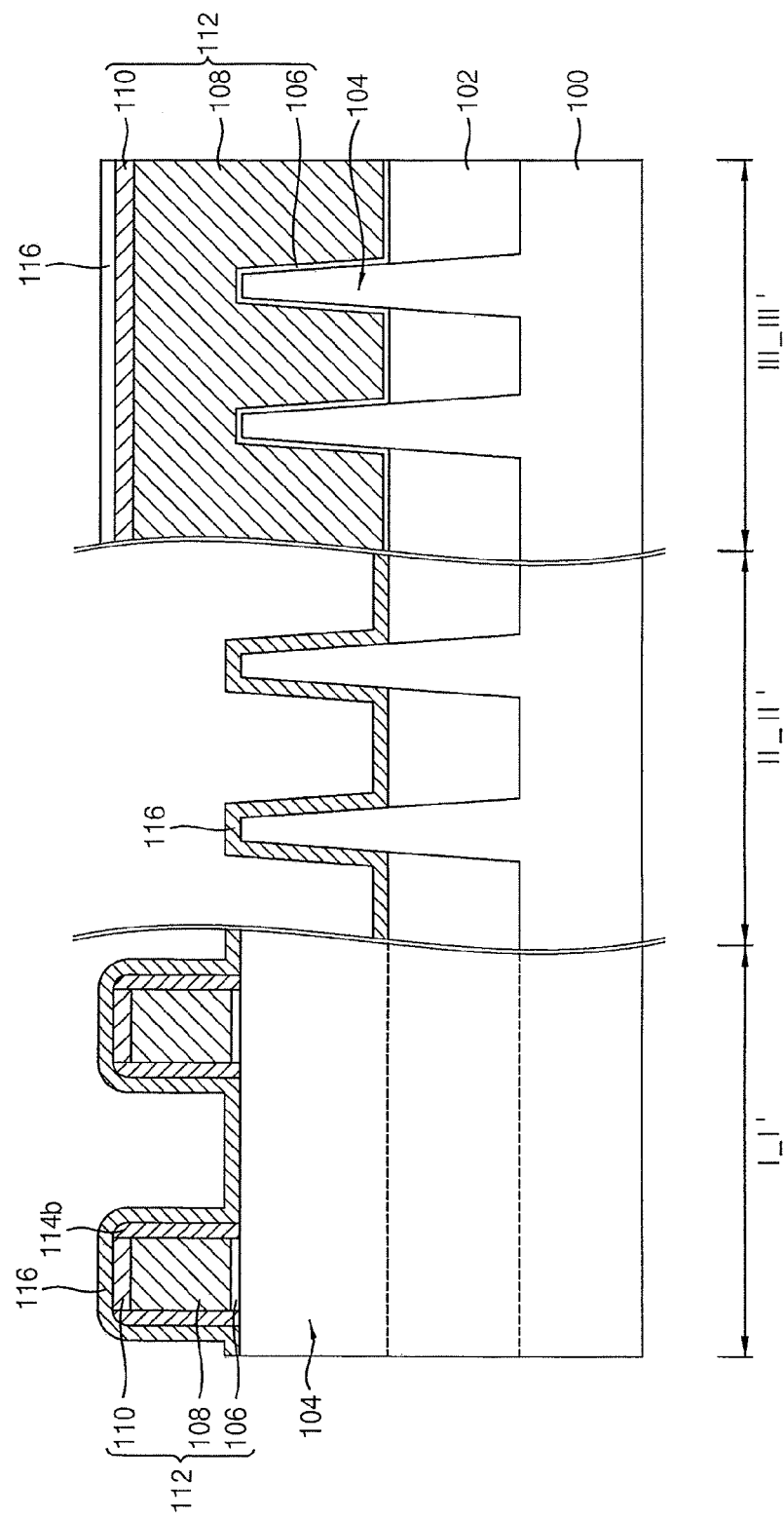
Figure 18:
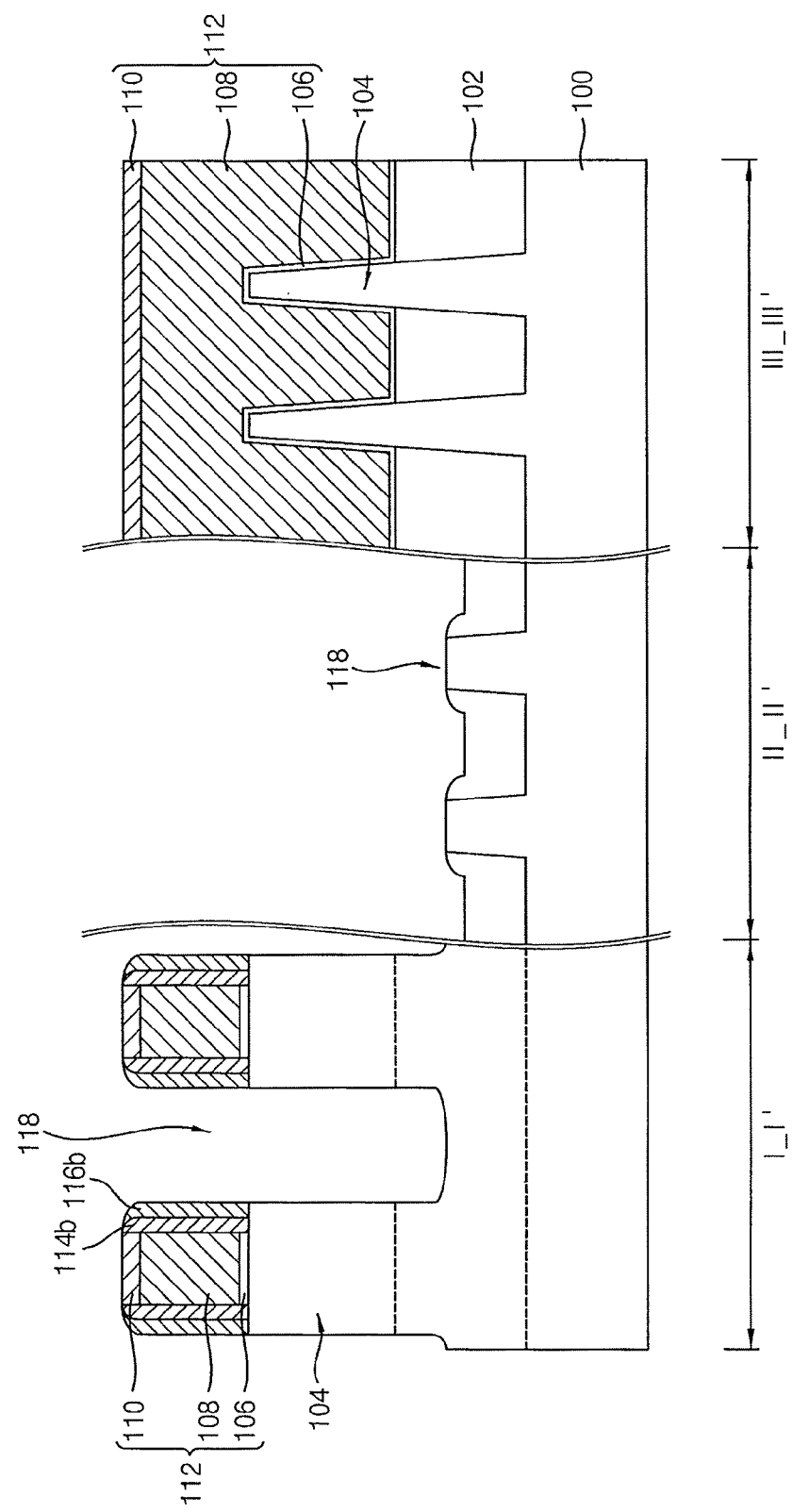

FIGS. 16 to 18 are cross-sectional views illustrating stages of a method of manufacturing a semiconductor device in accordance with an exemplary embodiment of the inventive concept. Processes substantially the same as those illustrated with reference to FIGS. 4 to 6 may be performed.

Referring to FIG. 16, the first spacer layer 114 may be anisotropically etched to form a first spacer 114b on sidewalls of each of the dummy gate structures 112. The first spacer 114b may not be bent at an interface between a top surface of the substrate and the sidewalls of each of the dummy gate structures 112.

Referring to FIG. 17, a second spacer layer 116 may be formed on the first spacer 114b, the first hard mask 110 and a surface of the substrate 100. The second spacer layer 116 may be formed by a process substantially the same as or similar to the process illustrated with reference to FIG. 7.

Referring to FIG. 18, the second spacer layer 116 may be anisotropically etched to form a second spacer 116b on sidewalls of the first spacer 114b. Thus, the first and second spacers 114b and 116b sequentially stacked may form a spacer structure, as shown in FIG. 15.

The preliminary active fin structure including the active fin 104 may be anisotropically etched using the dummy gate structures 112 and the second spacer 116b as an etch mask to form an active fin structure including an active fin 104a and a recess 118.

Processes substantially the same as those illustrated with reference to FIGS. 9 to 14 may be performed to form the semiconductor device including the gate structure of FIG. 15. As described above, a semiconductor device according to an exemplary embodiment of the inventive concept may include a FinFET, but may not be limited thereto. The semiconductor device according to an exemplary embodiment of the inventive concept may include various types of transistors including spacers on sidewalls of a gate structure. That is, the gate structure in the semiconductor device may not be limited thereto. For example, the semiconductor device may include a transistor including a planar-type gate structure. The planar-type gate structure may include a gate insulation pattern, a gate electrode pattern and a hard mask pattern sequentially stacked on a flat surface of a substrate.

The foregoing is illustrative of exemplary embodiments of the inventive concept and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments of the inventive concept and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor device, comprising:
    a substrate including an active fin structure, the active fin structure extending in a first direction and including a plurality of active fins with adjacent active fins divided by a recess;
    a plurality of gate structures, each of the plurality of gate structures extending in a second direction crossing the first direction and covering the active fins;
    a first spacer on sidewalls of each of the gate structures, the first spacer including silicon oxycarbonitride (SiOCN) and having a first carbon concentration; and
    a second spacer on sidewalls of the first spacer, the second spacer including SiOCN and having a second carbon concentration different from the first carbon concentration.

2. The semiconductor device of claim 1, wherein the first carbon concentration is higher than the second carbon concentration.

3. The semiconductor device of claim 2, wherein a difference between the first carbon and second carbon concentrations is in a range of about 3% to about 14%.

4. The semiconductor device of claim 1, wherein the first carbon concentration is in a range of about 4% to about 15%.

5. The semiconductor device of claim 1, wherein the first spacer has a first nitrogen concentration, and the second spacer has a second nitrogen concentration which is higher than the first nitrogen concentration.

6. The semiconductor device of claim 1, wherein each of the first and second spacers has an oxygen concentration in a range of about 20% to about 40%.

7. The semiconductor device of claim 1, wherein oxygen concentrations of the first and second spacers are substantially equal to each other.

8. The semiconductor device of claim 1, wherein silicon concentrations of the first and second spacers are substantially equal to each other.

9. The semiconductor device of claim 1, wherein the recess is formed between the second spacers.

10. The semiconductor device of claim 1, wherein each of the gate structures includes a gate insulation pattern, a gate electrode and a hard mask sequentially stacked, and the gate insulation pattern surrounds sidewalls and a bottom of the gate electrode.

11. The semiconductor device of claim 1, further comprising an epitaxial pattern in the recess.

12. The semiconductor device of claim 11, further comprising
an insulating interlayer covering the gate structure and the first and second spacers on the substrate; and
a contact plug penetrating through the insulating interlayer and contacting a portion of the second spacer and a top surface of the epitaxial pattern.

13. A semiconductor device, comprising:
a substrate including an active fin structure, the active fin structure extending in a first direction;
a plurality of gate structures, each of the plurality of gate structures extending in a second direction crossing the first direction;
a first spacer on sidewalls of each of the gate structures, the first spacer including silicon oxycarbonitride (SiOCN) and having a first carbon concentration; and
a second spacer on sidewalls of the first spacer, the second spacer including SiOCN and having a second carbon concentration different from the first carbon concentration.

14. The semiconductor device of claim 13, wherein the first carbon concentration is higher than the second carbon concentration.

15. The semiconductor device of claim 14, wherein a difference between the first carbon and second carbon concentrations is in a range of about 3% to about 14%.

16. The semiconductor device of claim 13, wherein the first carbon concentration is in a range of about 4% to about 15%.

17. The semiconductor device of claim 13, wherein the first spacer has a first nitrogen concentration, and the second spacer has a second nitrogen concentration which is higher than the first nitrogen concentration.

18. A semiconductor device, comprising:
a substrate including an active fin structure, the active fin structure extending in a first direction;
a plurality of gate structures, each of the plurality of gate structures including a gate insulation pattern, a gate electrode including a metal and a hard mask, and each of the plurality of gate structures extending in a second direction crossing the first direction;
a first spacer on sidewalls of each of the gate structures, the first spacer including silicon oxycarbonitride (SiOCN) and having a first carbon concentration; and
a second spacer on sidewalls of the first spacer, the second spacer including SiOCN and having a second carbon concentration lower than the first carbon concentration.

19. The semiconductor device of claim 18, wherein the first spacer has a first nitrogen concentration, and the second spacer has a second nitrogen concentration which is higher than the first nitrogen concentration.

20. The semiconductor device of claim 18, wherein the active fin structure includes a recess between the second spacers, and the semiconductor device further comprises an epitaxial pattern in the recess.

* * * * *